United States Patent [19]

Hirai et al.

[11] Patent Number: 5,576,127

[45] Date of Patent: Nov. 19, 1996

[54] COLOR FILTER AND PROCESS FOR PRODUCING THE COLOR FILTER

[75] Inventors: Hiroyuki Hirai; Kozo Sato, both of Kanagawa, Japan

[73] Assignee: Fuji Photo Film Co., Ltd., Minami-ashigara, Japan

[21] Appl. No.: 426,010

[22] Filed: Apr. 20, 1995

[30] Foreign Application Priority Data

Apr. 22, 1994 [JP] Japan .................................. 6-084315

[51] Int. Cl.$^6$ ....................................................... G03F 9/00
[52] U.S. Cl. ........................ 430/7; 430/20; 430/394; 430/396; 430/552; 430/553
[58] Field of Search ................................ 430/7, 20, 394, 430/396, 552, 553

[56] References Cited

U.S. PATENT DOCUMENTS 5,462,822  10/1995  Roosen et al. ............................. 430/7

*Primary Examiner*—Geraldine Letscher
*Attorney, Agent, or Firm*—Burns, Doane, Swecker & Mathis, LLP

[57] ABSTRACT

A process for producing a color filter is disclosed, which comprises the steps of (a) pattern-exposing a light-sensitive material comprising a light-transmitting substrate having thereon at least three silver halide emulsion layers, and (b) subjecting the exposed light-sensitive material to color development processing, bleaching and fixing processing, and washing processing, wherein the at least three silver halide emulsion layers (i) comprise a layer containing at least a cyan coupler, a layer containing at least a magenta coupler and a layer containing at least a yellow coupler and (ii) have different color sensitivity; and the cyan coupler is a compound represented by the following formula (I):

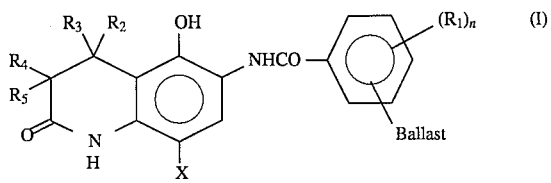

A color filter produced by the above-described process is also disclosed.

6 Claims, No Drawings

COLOR FILTER AND PROCESS FOR PRODUCING THE COLOR FILTER

FIELD OF THE INVENTION

The present invention relates to a color filter and a process for producing the color filter. More particularly, the present invention relates to a process for easily preparing a color filter having excellent heat resistance and light resistance.

BACKGROUND OF THE INVENTION

A color filter is used in a color face plate for, for example, CRT display, a photoelectric element plate for copying, a filter for single tube type TV cameras, a flat panel display using liquid crystals, and a color solid-state image sensor.

Generally employed color filters comprise regularly arranged three primary colors, i.e., blue, green and red. Color filters comprising four or more hues are also available for some uses. For example, color filters for camera tubes or for liquid crystal displays are required to have a black pattern for various purposes.

Known processes for producing these color filters include vacuum evaporation, dyeing, printing, pigment dispersion, electrodeposition, and resist electrodeposition transfer. However, color filters obtained by these processes have their several disadvantages, such as involvement of a complicated step, liability to pinholes or scratches, poor yield, and insufficient precision.

In order to overcome these disadvantages, methods of producing color filters by coupler-in-emulsion type development (for example, JP-A-63-261361) or coupler-in-developer type development (for example, JP-A-55-6342) each using a silver halide color light-sensitive material has been studied (the term "JP-A" as used herein means an unexamined published Japanese patent application). Since the latter development method requires at least three steps of color development, the processing steps are not easy. However, both the methods requires a light-sensitive material having a multi-layer structure, and formation of light-sensitive layers on such a hard substrate as a glass plate involves repetition of spin coating. Therefore, these processes are not sufficiently easy and simple to carry out.

The present inventors have investigated preparation of a color filter using a silver halide color light-sensitive material easily (Japanese Patent Application Nos. 5-302804 and 6-1363).

However, the improvement of the color filter using a silver halide color light-sensitive material has been desired because cyan dyes particularly have poor heat resistance.

SUMMARY OF THE INVENTION

An object of the present invention is to provide a color filter having excellent heat resistance and light resistance and a process for producing the color filter, which process requires no complicated step and is suitable for mass production.

In other words, an object of the present invention is to provide a process for easily producing a color filter containing a cyan dye having heat resistance and light resistance.

Another object of the present invention is to provide a micro color filter having high precision which comprises blue, green and red portions or cyan, magenta and yellow portions with excellent spectral transmission characteristics having no loss of color definition and a black portion with excellent spectral absorption characteristics.

These and other objects of the present invention have been accomplished by a process for producing a color filter, which comprises the steps of (a) pattern-exposing a light-sensitive material comprising a light-transmitting substrate having thereon at least three silver halide emulsion layers, and (b) subjecting the exposed light-sensitive material to color development processing, bleaching and fixing processing, and washing processing, wherein the at least three silver halide emulsion layers (i) comprise a layer containing at least a cyan coupler, a layer containing at least a magenta coupler and a layer containing at least a yellow coupler and (ii) have different color sensitivity; and the cyan coupler is a compound represented by the following formula (I):

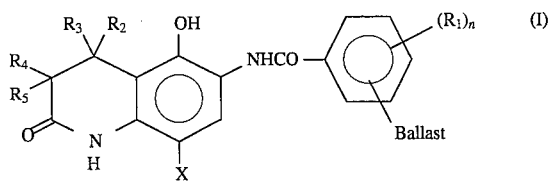

wherein $R_1$ represents a halogen atom, a substituted or unsubstituted alkyl group, a substituted or unsubstituted alkoxy group, a substituted or unsubstituted acylamino group or a substituted or unsubstituted carbamoyl group, and any two of plural $R_1$ groups may be combined with each other to form a 5- or 6-membered ring; n represents an integer of from 0 to 4; $R_2$ and $R_3$ are the same or different and each represents a substituted or unsubstituted alkyl group or a substituted or unsubstituted aryl group, and $R_2$ and $R_3$ may be combined with each other to form a 5- or 6-membered ring; $R_4$ and $R_5$ are the same or different and each represents a hydrogen atom or a substituted or unsubstituted alkyl group; X represents a hydrogen atom or a group which is eliminatable by an oxidation-coupling reaction with a developing agent; and Ballast represents a nondiffusive dye having 12 or more total carbon atoms, with the proviso that, when n is 2 or more, the plurality of $R_1$ groups may be the same or different.

Furthermore, these and other objects of the present invention have been accomplished by a color filter produced by the above-described process.

DETAILED DESCRIPTION OF THE INVENTION

In formula (I), $R_1$ represents a halogen atom, a substituted or unsubstituted alkyl group, a substituted or unsubstituted alkoxy group, a substituted or unsubstituted acylamino group, a substituted or unsubstituted carbamoyl group. Examples of the halogen atom represented by $R_1$ include a chlorine atom and a bromine atom. Examples of the substituted or unsubstituted alkyl group represented by $R_1$ include a methyl group, an ethyl group, an isopropyl group, an n-butyl group, a methoxyethyl group, a benzyl group and a β-phenethyl group. Examples of the substituted or unsubstituted alkoxy group represented by $R_1$ include a methoxy group, an ethoxy group, a butoxy group, a methoxyethoxy group and a dodecyloxy group. Examples of the substituted or unsubstituted acylamino group represented by $R_1$ include an acetylamino group, a butyloylamino group, an isobutyloylamino group, a benzoylamino group, a p-toluoylamino group and a p-chlorobenzoylamino group. Examples of the substituted or unsubstituted carbamoyl group represented by $R_1$ include a methylcarbamoyl group, a dimethylcarbamoyl group, a butylcarbamoyl group, a phenylcarbamoyl group, a piperidinocarbamoyl group and a morpholinocarbamoyl group. Examples of the ring formed by two $R_1$ groups include a benzene ring, a 6-membered saturated ring formed by a tetramethylene group, and a 5-membered ring formed by a methylenedioxy group.

$R_2$ and $R_3$ are the same or different, and each represents a substituted or unsubstituted alkyl group or a substituted or unsubstituted aryl group. Examples of the substituted or unsubstituted alkyl and aryl groups represented by $R_2$ and $R_3$ include the same groups as those defined for $R_1$. Examples of a combination of $R_2$ and $R_3$ include a methyl group and a methyl group, a methyl group and an ethyl group, an ethyl group and an ethyl group, a methyl group and a propyl group, a methyl group and an isopropyl group, a phenyl group and a phenyl group, and a methyl group and a phenyl group. Examples of the ring formed by $R_2$ and $R_3$ include a cyclopentane ring and a cyclohexane ring. Preferably, both $R_2$ and $R_3$ are a methyl group or $R_2$ and $R_3$ are combined with each other to form a cyclohexane ring.

$R_4$ and $R_5$ are the same or different, and each represents a hydrogen atom or a substituted or unsubstituted alkyl group. Examples of the substituted or unsubstituted alkyl group represented by $R_4$ and $R_5$ are the same groups as those defined for $R_1$. Examples of a combination of $R_4$ and $R_5$ include a hydrogen atom and a hydrogen atom, a hydrogen atom and a methyl group, a hydrogen atom and an ethyl group, and a methyl group and a methyl group. Preferably, both $R_4$ and $R_5$ are a hydrogen atom.

X represents a hydrogen atom or a dye which is eliminatable by an oxidation-coupling reaction with a developing agent (an eliminatable group). Examples thereof include a hydrogen atom, a halogen atom (e.g., chlorine, bromine), an alkoxy group (e.g., ethoxy, methanesulfonamidoethoxy, methanesulfonylethoxy), an aryloxy group (e.g., phenoxy, 4-carboxyphenoxy, 4-tert-octylphenoxy), an acyloxy group (e.g., acetoxy, benzoyloxy), a sulfonyloxy group (e.g., methanesulfonyloxy, benzenesulfonyloxy), a carbonamido group (e.g., heptafluorobutyloylamino, trifluoroacetylamino), a sulfonamido group (e.g., methanesulfonylamino, p-chlorobenzenesulfonylamino), an alkoxycarbonyloxy group (e.g., ethoxycarbonyloxy, isobutoxycarbonyloxy), an arylcarbonyloxy group (e.g., phenoxycarbonyloxy, 1-naphthyloxycarbonyloxy), an imido group (e.g., succinimido, 1-methylhydantoinyl, 5,5-dimethylhydantoinyl, 5,5-dimethyloxyazolydine-2,5-dion-3-yl) and a pyrazol group. Among these, preferred are a hydrogen atom, a chlorine atom, an aryloxy group and a sulfonyloxy group.

Ballast is a nondiffusive group having 12 or more total carbon atoms. Examples thereof include a straight chain or branched alkyl group (e.g., dodecyl, hexadecyl, isostearyl), an alkoxy group (e.g., dodecyloxy, 2-hexadecyloxy, 2-octadecyloxy), an acylamino group (e.g., hexadecanoylamino, octadecanoylamino, 2-(2,4-di-tert-amylphenoxy)butyloylamino, 2-(2,4-di-tert-amylphenoxy)octanoylamino), and a carbamoyl group (e.g., dodecylcarbamoyl, dodecyloxypropylcarbamoyl, 2,4-di-tert-amylphenoxypropylcarbamoyl, N-methyl-N-octadecylcarbamoyl). Among these, preferred are an alkoxy group, an acylamino group and a substituted carbamoyl group, which each has 15 or more total carbon atoms.

Examples of the cyan couplers for use in the present invention are shown below.

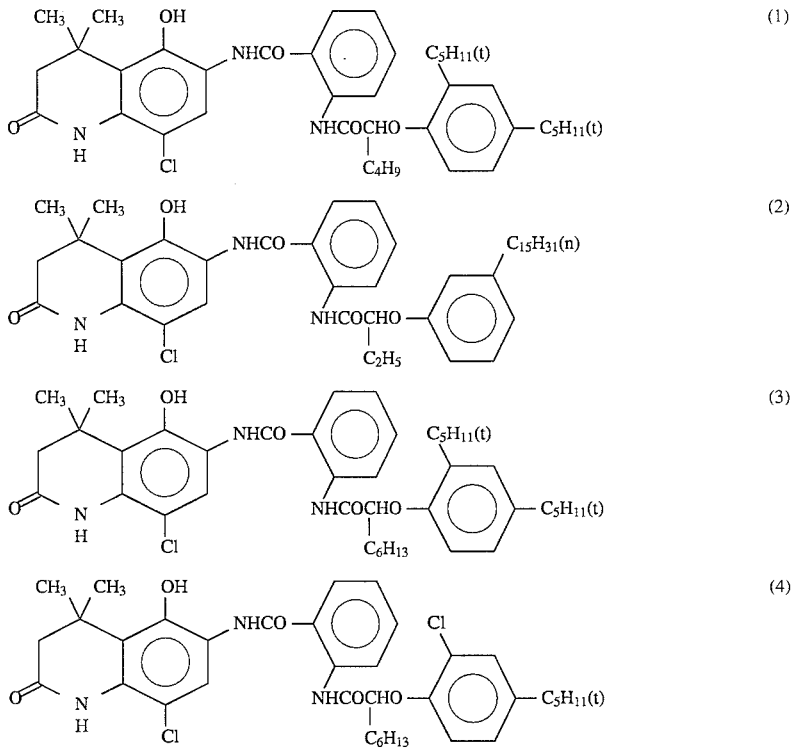

-continued
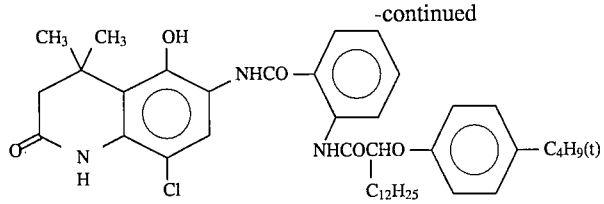
(5)
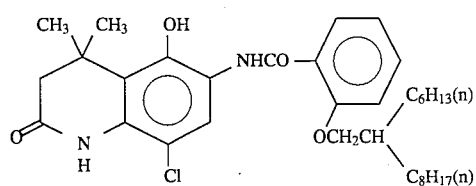
(6)
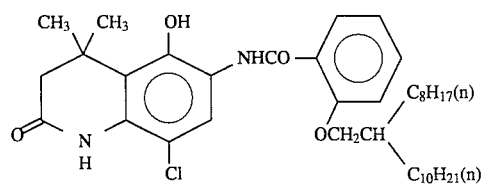
(7)
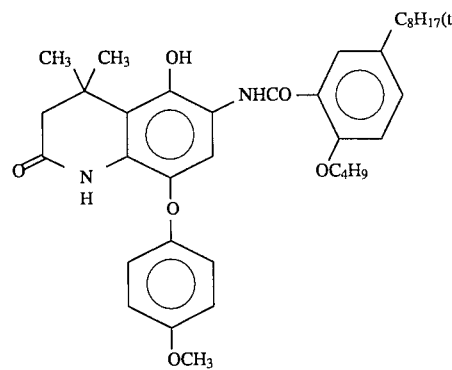
(8)
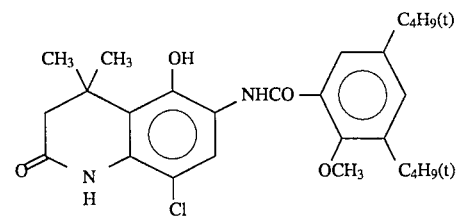
(9)
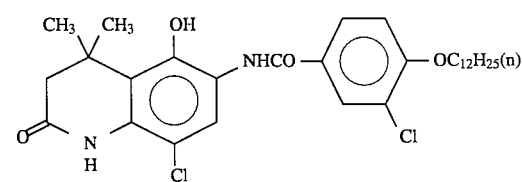
(10)
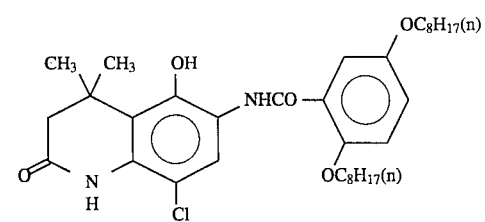
(11)

-continued
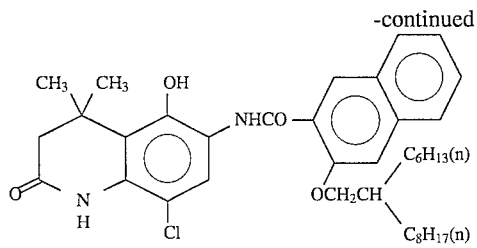 (12)
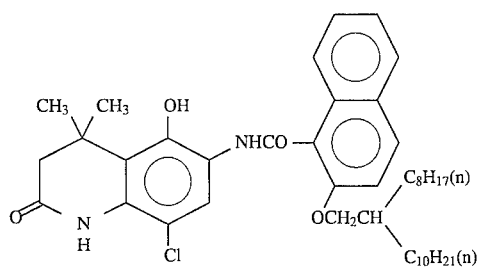 (13)
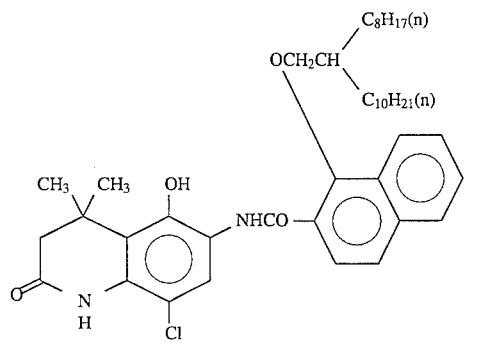 (14)
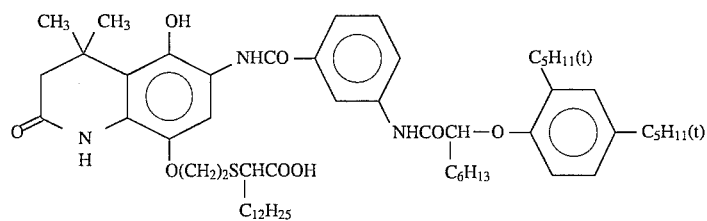 (15)
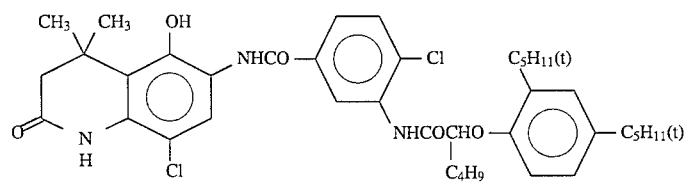 (16)
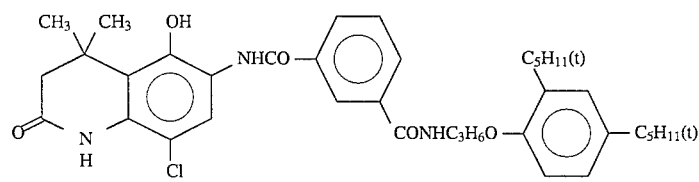 (17)
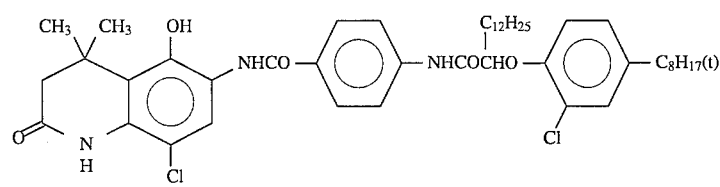 (18)

-continued
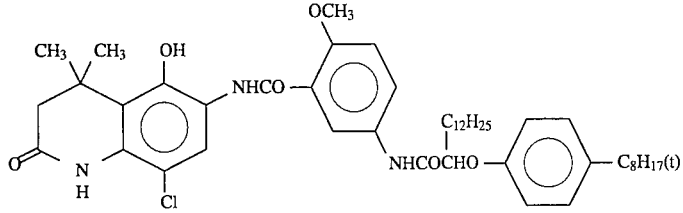 (19)
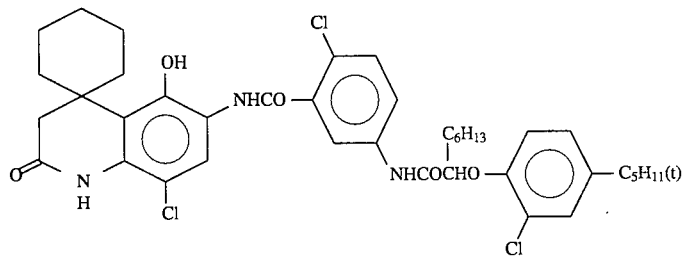 (20)
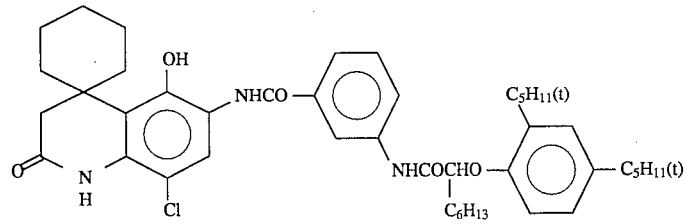 (21)
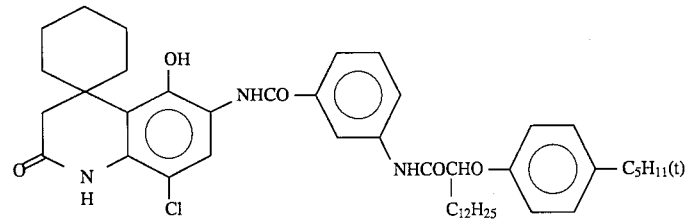 (22)
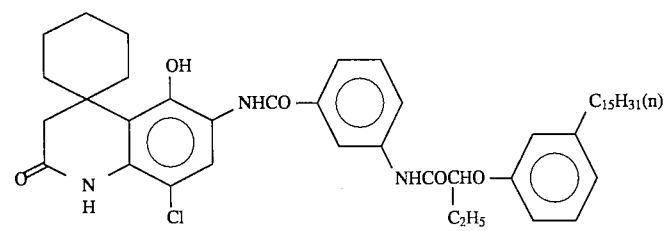 (23)
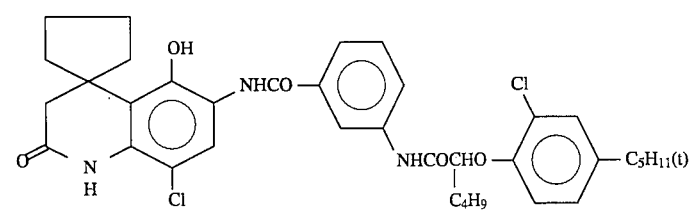 (24)
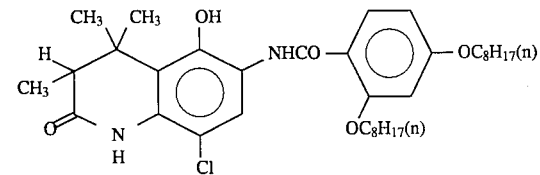 (25)

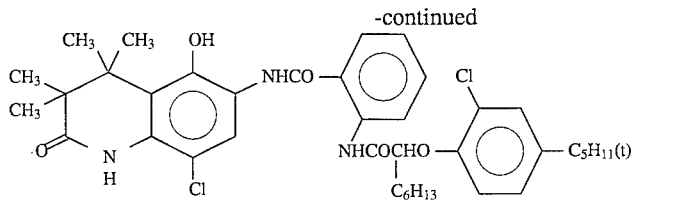
(26)

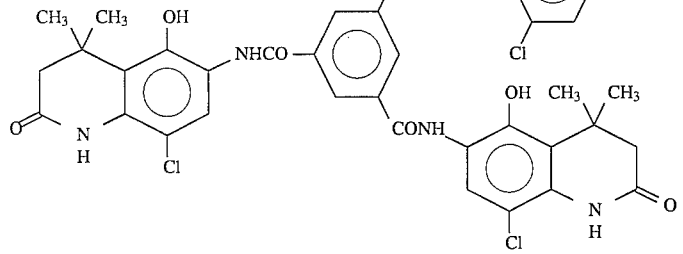
(27)

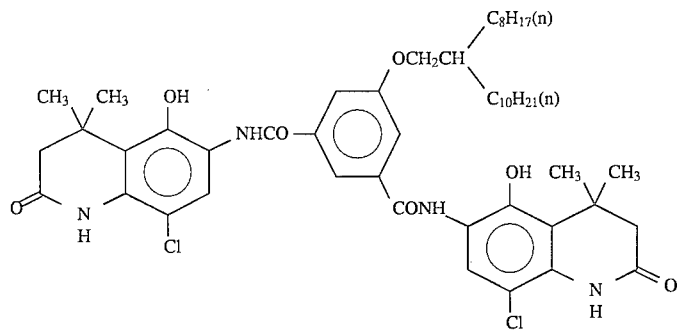
(28)

The cyan couplers represented by formula (I) are known, and the synthesis method thereof is described in JP-B-4-20173 (the term "JP-B" as used herein means an "examined Japanese patent publication").

Binders or protective colloids for use in the silver halide emulsion, intermediate or protective layers of the light-sensitive material according to the present invention include gelatin and other hydrophilic polymers, with gelatin being advantageous. Examples of the hydrophilic polymers other than gelatin include homo- or copolymers, such as polyvinyl alcohol, polyvinyl alcohol partial acetal, polyvinyl butyral, poly-N-vinylpyrrolidone, polyacrylic acid, polyacrylamide, polyvinylimidazole, polyvinylpyrazole, carrageenan, gum arabic, and cellulose derivatives, such as hydroxyalkyl cellulose, carboxymethyl cellulose, cellulose sulfate, cellulose acetate hydrogen phthalate, and sodium alginate.

Graft polymers of gelatin and other high polymers are also effective. For example, gelatin to which a homo- or copolymer of a vinyl monomer, such as acrylic acid, (meth)acrylic acid or a derivative thereof (e.g., an ester or an amide), acrylonitrile or styrene, is grafted can be used. In particular, graft polymers of gelatin and a polymer which is compatible with gelatin to some extent, such as (meth)acrylic acid, (meth)acrylamide or a hydroxyalkyl methacrylate, are preferred. Examples of these graft copolymers are described in U.S. Pat. Nos. 2,763,625, 2,831,767, and 2,956,884, and JP-A-56-65133.

Typical synthetic hydrophilic high polymers which can be used in the present invention are described in, e.g., West German Patent Publication (OLS) 2,312,708, U.S. Pat. Nos. 3,620,751 and 3,879,205, and JP-B-43-7561.

The above-mentioned hydrophilic polymers may be used either individually or in combination of two or more thereof.

Examples of gelatin for use in the present invention include alkali-processed gelatin, acid-processed gelatin, enzyme-processed gelatin, and a mixture thereof. Gelatin derivatives obtained by reacting gelatin with various compounds, such as an acid halide, an acid anhydride, an isocyanate compound, bromoacetic acid, an alkanesulfonic acid, a vinylsulfonamide compound, a maleinimide compound, a polyalkylene oxide, and an epoxy compound are also useful. Specific examples of the gelatin derivatives are given in U.S. Pat. Nos. 2,614,928, 3,132,945, 3,186,846, and 3,312,553, British Patents 861,414, 1,033,189, and 1,005, 784, and JP-B-42-26845.

Examples of the material constituting the light-transmitting substrate for use in the present invention include those made of polyethylene terephthalate, polybutylene terephthalate, polyethylene, naphthalate, polystyrene, polycarbonate, polyether sulfone, cellulose acetate, soda-lime glass, borosilicate glass, and quartz.

The surface of the substrate may be subjected to undercoating processing, if necessary. Further, surface processing, such as glow discharge, corona discharge, and ultraviolet irradiation, may be conducted.

Furthermore, the color filter light-sensitive material may be produced by coating a silver halide emulsion layer on another support and transfer-adhering the emulsion side thereof on a light-transmitting substrate.

The light-transmitting substrate may be used in the form of, for example, a plate, a sheet, or a film. The thickness of the substrate can be selected appropriately according to the purpose and material and is usually from 0.01 to 10 mm. For example, a glass substrate usually has a thickness of from 0.3 to 3 mm.

The light-sensitive materials for use in the present invention preferably include coupler-in-developer type color reversal films, coupler-in-emulsion type color reversal films, color negative films by color negative processing, color films for displays, and auto positive color films. For the details of these light-sensitive materials, refer to T. H. James (ed.), *The Theory of the Photographic Process*, 4th Ed., MacMillan (1977) or *Kagaku Shashin Binran I*, p 559–564 & 569, Maruzen Co., Ltd. Additionally, coupler-in-emulsion type color films containing two or more couplers capable of developing different hues on color development in the same light-sensitive silver halide emulsion layer as described in JP-A-63-261361 and coupler-in-developer type color films which are developed with a developer containing one developing agent and two or more couplers capable of developing different colors for the same light-sensitive silver halide as described in JP-A-64-79701 are also employable.

The preferable material and the preferable method for processing the material for use in the present invention will be explained below.

Silver halides in the light-sensitive silver halide emulsion layers for use in the present invention preferably include silver chloride, silver chlorobromide, silver bromide, silver iodobromide, and silver chloroiodobromide. The average iodide content is preferably 3 mol % or less, more preferably 0 mol %. Substantially pure silver bromide or chloride is more preferred.

The silver halide grains in emulsions may have a regular crystal form, such as a cubic form, an octahedral form or a tetradecahedral form, an irregular crystal form, such as a spherical form or a plate form, a crystal form having a crystal defect, such as a twinning plane, or a composite crystal form thereof. Cubic grains or octahedral grains are particularly preferred.

The silver halide grains may have a wide range of grain size, including from fine grains of about 0.2 μm or smaller to giant grains having a projected area diameter reaching about 10 μm. While either a mono-dispersed emulsion or a poly-dispersed emulsion is used, a mono-dispersed emulsion having a grain size of from 0.1 to 1.5 μm with a coefficient of variation of 15% or less is preferred.

The silver halide emulsions can be prepared by the processes described in, e.g., *Research Disclosure* (hereinafter abbreviated as RD), Vol. 176, No.17643 (Dec., 1978), pp.22–23, "I. Emulsion Preparation and Types", ibid, No.18716 (Nov., 1979), 648, Glafkides, *Chemic et Phisique Photographique*, Paul Montel (1967), G. F. Duffin, *Photographic Emulsion Chemistry*, Focal Press (1966), and V. L. Zelikman et al., *Making and Coating Photographic Emulsion*, Focal Press (1964).

Mono-dispersed emulsions described in U.S. Pat. Nos. 3,574,628 and 3,655,394 and British Patent 1,413,748 are preferably used as well.

Tabular grains having an aspect ratio of about 5 or more are also useful. Such tabular grains can easily be prepared by the processes described, e.g., in Gutoff, *Photographic Science and Engineering*, Vol.14, pp.248–257 (1970), U.S. Pat. Nos. 4,434,226, 4,414,310, 4,433,048, and 4,439,520, and British Patent 2,112,157.

The silver halide grains may have a uniform crystal structure throughout the individual grains or may be heterogeneous grains including those composed of a core and an outer shell or layers different in halogen compositions, and those having fused thereto silver halide of different halogen composition through epitaxy. Silver halide grains fused with compounds other than silver halides, e.g., silver rhodanide or lead oxide may also be used. A mixture comprising grains of various crystal forms is employable.

Silver halide emulsions are usually subjected to physical ripening, chemical ripening, and spectral sensitization. Additives which can be used in these steps are described in RD, Nos. 17643 and 18716 as hereinafter listed. Known photographic additives which can be used in the present invention are also described in the same publications as tabulated below.

| Additive | RD 17643 | RD 18716 |
|---|---|---|
| 1. Chemical Sensitizer | p. 23 | p. 648, right column (RC) |
| 2. Sensitivity Increasing Agent | | p. 648, right column (RC) |
| 3. Spectral Sensitizer, Supersensitizer | pp. 23–24 | p. 648, RC to p. 649, RC |
| 4. Brightening Agent | p. 24 | |
| 5. Antifoggant, Stabilizer | p. 24–25 | p. 649, RC |
| 6. Light Absorbent, Filter Dye, Ultraviolet Absorbent | p. 25–26 | p. 649, RC to p. 650, left column (LC) |
| 7. Stain Inhibitor | p. 25, RC | p. 650, LC to RC |
| 8. Dye Image Stabilizer | p. 25 | |
| 9. Hardening Agent | p. 26 | p. 651, LC |
| 10. Binder | p. 26 | p. 651, LC |
| 11. Plasticizer, Lubricant | p. 27 | p. 650, RC |
| 12. Coating Aid, Surface Active Agent | pp. 26–27 | p. 650, RC |
| 13. Antistatic Agent | p. 27 | p. 650, RC |

Various color couplers can be used in the present invention, and examples of the color couplers are described in RD, No.17643, VII-C to G.

With regard to the coupler for use in the present invention, 2-equivalent color couplers having the coupling site thereof substituted with a releasable group are more preferred than 4-equivalent color couplers having a hydrogen atom at the coupling site because the former can reduce the silver amount for coating.

Examples of the yellow coupler for use in the present invention include oil-protected type acylacetamide couplers. Specific examples thereof are given in U.S. Pat. Nos. 2,407,210, 2,875,057, and 3,265,506. Two-equivalent yellow couplers are preferred as mentioned above. Included in these couplers are yellow couplers of oxygen-release type described in U.S. Pat. Nos. 3,408,194, 3,447,928, 3,935,501, and 4,022,620; and nitrogen-release type yellow couplers described in JP-B-58-10739, U.S. Pat. Nos. 4,401,752 and 4,326,024, RD, No.18053 (April 1979), British Patent 1,425,020, and West German Patent OLS Nos. 2,219,917, 2,261,361, 2,329,587, and 2,433,812. In particular, α-pivaloylacetanilide couplers produce dyes having excellent stability especially against light, and α-benzoylacetanilide couplers produce dyes having high color density.

Examples of the magenta coupler for use in the present invention include oil-protected type 5-pyrazolone couplers and pyrazoloazole couplers such as pyrazolotriazoles. The 5-pyrazolone couplers are preferably substituted with an arylamino group or an acylamino group at the 3-position thereof in view of the hue or density of a developed color. Typical examples of such 5-pyrazolone couplers are described in U.S. Pat. Nos. 2,311,082, 2,343,703, 2,600,788, 2,908,573, 3,062,653, 3,152,896, and 3,936,015. Releasable groups of 2-equivalent 5-pyrazolone couplers preferably include nitrogen-releasable groups described in U.S. Pat. No. 4,310,619 and arylthio groups described in U.S. Pat. No.

4,351,897. Further, 5-pyrazolone couplers having a ballast group described in European Patent 73,636 provide high color density.

Examples of the pyrazoloazole couplers for use in the present invention include pyrazolobenzimidazoles described in U.S. Pat. No. 3,369,879, and preferably pyrazolo[5,1-c][1,2,4]-triazoles described in U.S. Pat. No. 3,725,067, pyrazolotetrazoles described in RD, No.24220 (June, 1984), and pyrazolopyrazoles described in RD, No.24230 (June, 1984). From the standpoint of reduction in undesired yellow absorption and stability of a developed color against light, imidazo[1,2-b]pyrazoles described in European Patent 119,741 are preferred, and pyrazolo[1,5-b][1,2,4]triazole described in European Patent 119,860 is particularly preferred.

The compounds represented by formula (I) are used as a cyan coupler in the present invention. Typical examples of such couplers include phenol cyan couplers having an alkyl group having at least two carbon atoms at the m-position of the phenol nucleus described in U.S. Pat. No. 3,772,002, 2,5-diacylamino-substituted phenol couplers described in U.S. Pat. Nos. 2,772,162, 3,758,308, 4,126,396, 4,334,011, and 4,327,173, West German Patent OLS No. 3,329,729 and JP-A-59-166956 and phenol couplers having a phenylureido group at the 2-position and an acylamino group at the 5-position described in U.S. Pat. Nos. 3,446,622, 4,333,999, 4,451,559, and 4,427,767.

Dye-forming couplers may be in the form of a polymer. Examples thereof are described in U.S. Pat. Nos. 3,451,820, 4,080,211, and 4,367,282, and British Patent 2,102,173.

Couplers capable of releasing a photographically useful residue on coupling are also used to advantage. Examples of suitable DIR couplers which release a development inhibitor are described in RD, No.17643, Items VII-F, JP-A-57-151944, JP-A-57-154234, JP-A-60-184248, and U.S. Pat. No. 4,248,962.

Examples of suitable couplers which imagewise release a nucleating agent or a development accelerator at the time of development are described in British Patents 2,097,140 and 2,131,188, JP-A-59-157638, and JP-A-59-170840.

Couplers additionally used in the light-sensitive material of the present invention include competing couplers described in U.S. Pat. No. 4,130,427; polyequivalent couplers described in U.S. Pat. Nos. 4,283,472, 4,338,393, and 4,310,618; couplers capable of releasing a DIR redox compound described in JP-A-60-185950; and couplers capable of releasing a dye which restores its color after release described in EP-A-173302.

The couplers are introduced into light-sensitive materials by various known dispersion methods.

High-boiling solvents for use in an oil-in-water dispersion method are described in, e.g., U.S. Pat. No. 2,322,027.

With respect to a latex dispersion method, the steps involved, the effects, and specific examples of impregnating latices are described in U.S. Pat. No. 4,199,363 and West German Patent (OLS) Nos. 2,541,274 and 2,541,230.

The coupler-in-developer type light-sensitive materials use no hydrophobic couplers but couplers soluble in a developer, and the developer-soluble couplers are added to a color developer but not to a light-sensitive material. Specific examples of such couplers are described in JP-A-64-79701.

Internal latent image type emulsions and their silver halide grains for use in direct positive light-sensitive materials, such as auto positive color films and auto positive color paper, are described in JP-A-63-81337 and JP-A-1-282545.

The internal latent image type emulsion may be either a conversion type emulsion or a core/shell type emulsion, with the latter being preferred.

It is preferred that the light-sensitive material of the present invention is a direct positive light-sensitive material having a silver halide emulsion which is a beforehand unfogged internal latent image type silver halide emulsion.

With respect to direct positive light-sensitive materials, the details of useful color couplers are described in JP-A-63-81337, p 19–27, and the details of various compounds which can be used in the light-sensitive material, such as color fog inhibitors, discoloration inhibitors, and dyes, are described in the same specification, p 28–30.

The light-sensitive materials may be development processed according to usual methods as described in RD, No.17643, pp.28–29 and ibid , 615, left to right columns. They may be subjected to prehardening processing or post hardening processing.

Examples of the pattern exposure system for use in the present invention include a planar exposure system and a scanning exposure system. Examples of the scanning system include a line (slit) scanning system and a point scanning system using a leaser beam and the like.

Examples of a light source include tungsten lamp, halogen lamp, fluorescent lamp (e.g., three wavelengths type fluorescent lamp), laser lamp, and light emitting diode. Preferred are halogen lamp, fluorescent lamp and laser lam In using a direct positive color light-sensitive material, the material after pattern exposure is subjected to color development with a surface developing solution containing an aromatic primary amine color developing agent preferably at a pH of 12 or lower, particularly preferably from 10.0 to 11.0, either after or simultaneously with fogging by light or a nucleating agent, followed by bleaching and fixing to form a direct positive color image.

Fogging in this embodiment may be effected by either a method called light fogging in which the entire surface of a light-sensitive layer is subjected to second exposure or a method called chemical fogging in which a light-sensitive material is developed in the presence of a nucleating agent. Development may be conducted in the presence of both a nucleating agent and fogging light. Further, a light-sensitive material containing a nucleating agent may be subjected to fogging exposure.

Details of the light fogging method are described in JP-A-63-81337, 33, 1.17 to 35, the last line, and details of the useful nucleating agents are described in the same specification, pp.50–53. Preferred nucleating agents are those represented by formulae (N-1) and (N-2) shown in that specification.

Further, nucleation accelerators which can be used in the present invention are also described in the same specification. Preferred nucleation accelerators are Compound Nos. (A-1) to (A-13) shown on pp.55 to 57.

The color filter produced by the process of the present invention may have a heat- and water-resistant protective layer having a high specific resistance as an outermost layer. Examples of the resins providing such a protective layer are described in U.S. Pat. Nos. 4,698,295 and 4,668,601, EP-A-179636, JP-A-3-163416 and JP-A-1-27610.

A transparent electrode, such as an indium-tin oxide layer (ITO), may be provided on the color filter by deposition, for example, by vacuum evaporation or sputtering.

Furthermore, a polarizer or a phase retarder may be provided on the light-transmitting substrate of the color filter on its side opposite to the emulsion layer.

The present invention will now be illustrated in greater detail with reference to the following examples, but it should be understood that the present invention is not construed as being limited thereto. All percents are by weight unless otherwise indicated.

EXAMPLE 1

Layers from 1st to 9th shown below were applied simultaneously on a 100 μm thick polyethylene terephthalate film having a gelatin subbing layer to prepare color light-sensitive material 101. In the following layer structure, the numeral for each component is the spread in terms of gram per m$^2$. The spreads of silver halide emulsions and colloidal silver emulsions are expressed in terms of silver amount (g) per m$^2$. The emulsions used were prepared by the method for preparing emulsion EM-1 hereinafter described.

1st Layer (Peeling Layer):
  Hydroxyethyl cellulose 0.50
  Terminal alkyl modified-polyvinyl alcohol 0.15 (saponification degree: 98%, polymerization degree: 300)

2nd Layer (Gelatin Layer):
  Gelatin 0.50

3rd Layer (Blue-Sensitive Layer):
  Silver bromide (average grain size: 0.45 μm; 0.47 size distribution: 8%; octahedral grains) spectrally sensitized with blue-sensitizing dyes (ExS-5 & 6)
  Gelatin 1.54
  Yellow coupler (ExY-1) 1.13
  Discoloration inhibitor (Cpd-12) 0.15
  Stain inhibitor (Cpd-7) 0.07
  Polymer (Cpd-13) 0.14
  High-boiling solvent (Solv-4) 0.39
  Discoloration inhibitor (Cpd-12) 0.01

4th Layer (Intermediate Layer):
  Gelatin 1.13
  Color mixing inhibitor (Cpd-3) 0.08
  High-boiling solvent (Solv-1) 0.05
  High-boiling solvent (Solv-2) 0.12
  UV Absorbent (Cpd-1) 0.01
  UV Absorbent (Cpd-8) 0.02
  UV Absorbent (Cpd-9) 0.06
  UV Absorbent (Cpd-10) 0.04
  Polymer (Cpd-11) 0.05
  Yellow dye (YF-1) 0.15

5th Layer (Green-Sensitive Layer):
  Silver bromide (average grain size: 0.32 μm; 0.29 size distribution: 8%; octahedral grains) spectrally sensitized with green-sensitizing dye (ExS-4)
  Gelatin 1.56
  Magenta coupler (ExM-1) 0.41
  Discoloration inhibitor (Cpd-4) 0.46
  Stain inhibitor (Cpd-5) 0.02
  Stain inhibitor (Cpd-6) 0.04
  Discoloration inhibitor (Cpd-7) 0.06
  High-boiling solvent (Solv-2) 1.11
  High-boiling solvent (Solv-3) 0.29

6th Layer (Intermediate Layer):
  Gelatin 1.13
  Color mixing inhibitor (Cpd-3) 0.08
  High-boiling solvent ( Solv-1 ) 0.05
  High-boiling solvent ( Solv-2 ) 0.12
  UV Absorbent (Cpd-1) 0.01
  UV Absorbent (Cpd-8) 0.02
  UV Absorbent (Cpd-9) 0.06
  UV Absorbent (Cpd-10) 0.04
  Polymer 0.05

7th Layer (Red-Sensitive Layer):
  Silver bromide (average grain size: 0.3 μm; 0.40 size distribution: 8%; octahedral grains) spectrally sensitized with red-sensitizing dyes (ExS-1, 2 & 3)
  Gelatin 1.89
  Cyan coupler (ExC-1) 0.28
  Cyan coupler (ExC-2) 0.32
  Discoloration inhibitor (Cpd-1) 0.04
  Discoloration inhibitor (Cpd-2) 0.11
  High-boiling solvent (Solv-1) 0.30
  Discoloration inhibitor (Cpd-18) 0.02
  Polymer 0.05

8th Layer (Irradiation-Preventive Dye Layer):
  Gelatin 0.51
  Irradiation preventive dyes (a mixture of 0.02 Dye-1 and 2 at a molar ratio of 1:3)

9th Layer (Protective Layer.):
  Gelatin 1.43
  Colloidal silver emulsion (average grain 0.20 size: 0.02 μm)
  Surface active agent (Cpd-14) 0.06
  Hardening agent (H-1) 0.12

Preparation of Emulsion EM-1:

An aqueous solution of potassium bromide and an aqueous solution of silver nitrate were simultaneously added to an aqueous gelatin solution at 60° C. with vigorous stirring over a period of 8 minutes to form octahedral silver bromide grains having an average grain size of 0.15 μm. During the grain formation, 0.3 g, per mole of silver, of 3,4-dimethyl-1,3-thiazoline-2-thione was added to the system. To the resulting emulsion were added successively 6 mg of sodium thiosulfate and 7 mg of chloroauric acid tetrahydrate per mole of silver, followed by heating at 75° C. for 80 minutes to carry out chemical sensitization. The thus formed grains were allowed to grow under the same precipitation conditions as above to finally obtain a mono-dispersed emulsion of octahedral core/shell silver bromide grains having an average particle size of 0.32 μm. The coefficient of variation of the grain size was about 8%. To the emulsion were added 1.5 mg of sodium thiosulfate and 1.5 mg of chloroauric acid tetrahydrate per mole of silver, followed by heating at 60° C. for 60 minutes to obtain an internal latent image type silver halide emulsion.

Each of the light-sensitive layers of sample 101 further contained nucleating agents ExZK-1 and ExZK-2 in an amount of $10^{-3}$% and $10^{-2}$%, respectively, and a nucleation accelerator Cpd-15 in an amount of $10^{-2}$%, each based on the silver halide. The light-sensitive layers each furthermore contained a silver halide stabilizer Cpd-16. In addition, each constituting layer contained sodium dodecylbenzenesulfonate as an emulsifying agent or a dispersant, ethyl acetate as an auxiliary solvent, Cpd-17 as a coating aid, and potassium polystyrenesulfonate as a thickener.

Compounds used in the sample preparation were as follows.

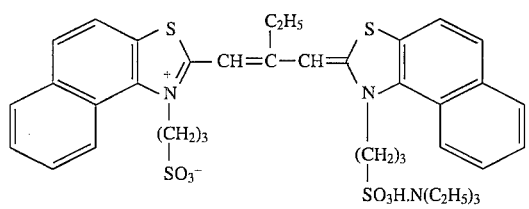
ExS-1
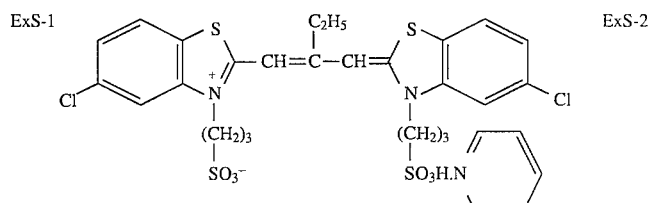
ExS-2
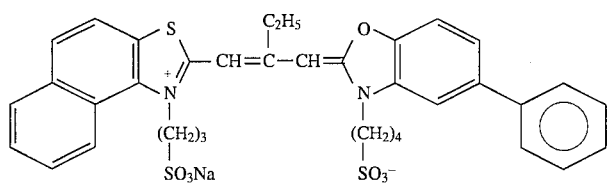
ExS-3
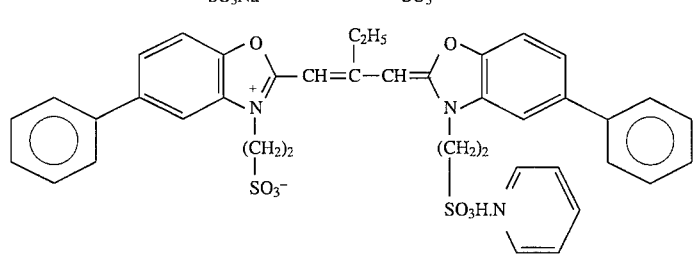
ExS-4
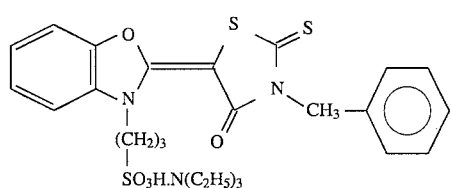
ExS-5
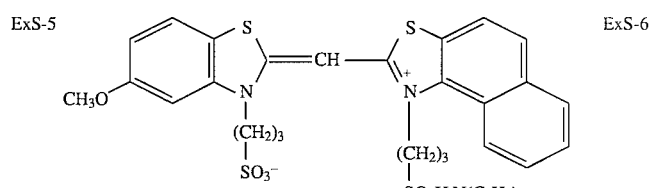
ExS-6
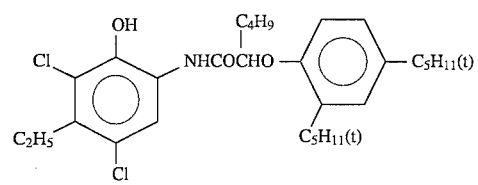
ExC-1
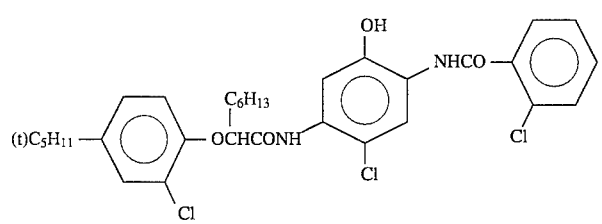
ExC-2
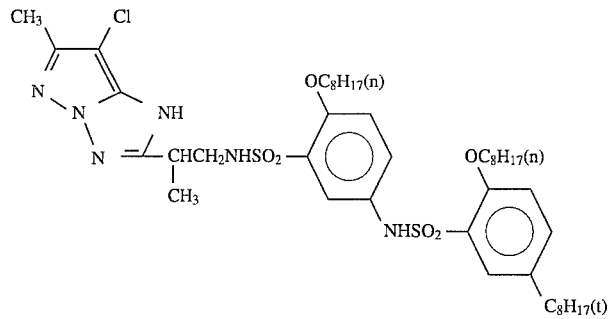
ExM-1

-continued
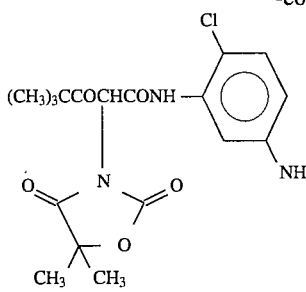 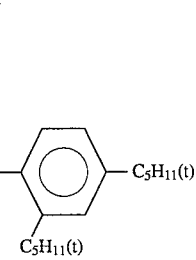 ExY-1
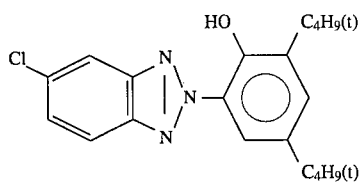 Cpd-1  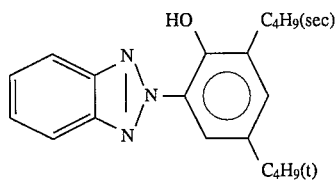 Cpd-2
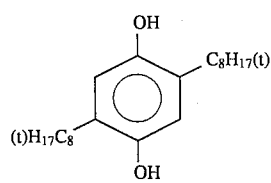 Cpd-3  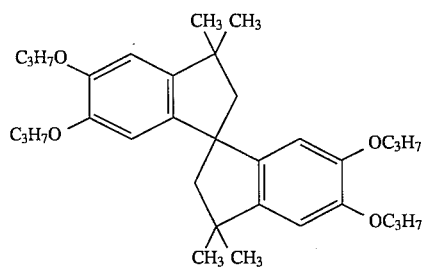 Cpd-4
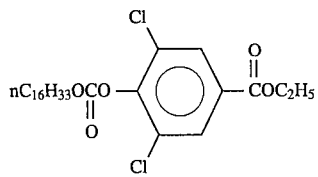 Cpd-5  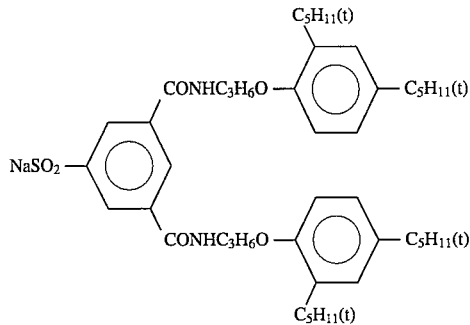 Cpd-6
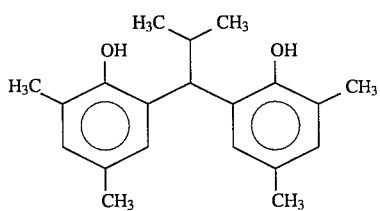 Cpd-7  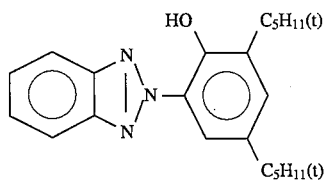 Cpd-8
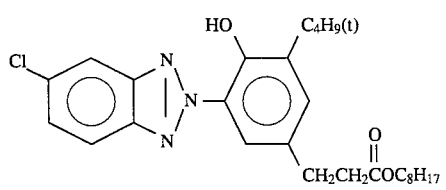 Cpd-9  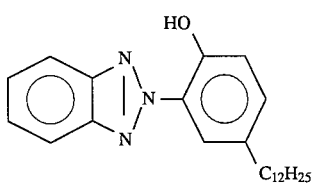 Cpd-10
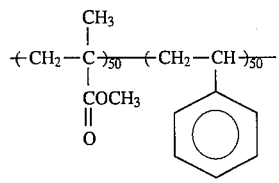 Cpd-11

-continued
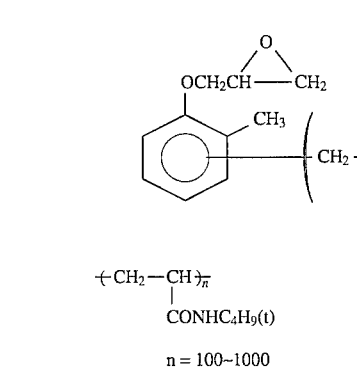  Cpd-12
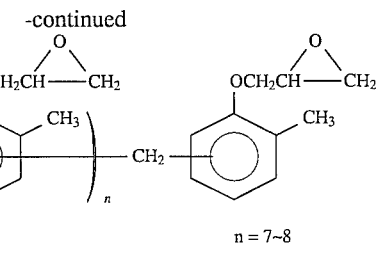  Cpd-14
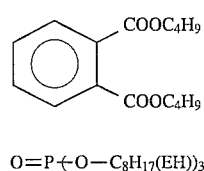  Cpd-13
n = 100~1000
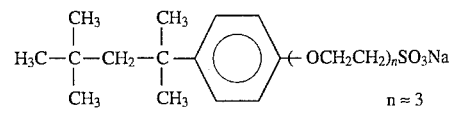  Cpd-15
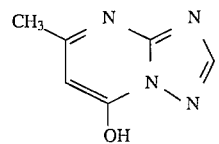  Cpd-16
CH$_2$COOCH$_2$CH(C$_2$H$_5$)C$_4$H$_9$   Cpd-17
|
NaO$_3$S—CHCOOCH$_2$CH(C$_2$H$_5$)C$_4$H$_9$
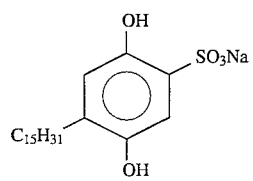  Cpd-18
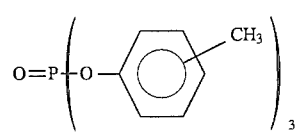  Solv-1
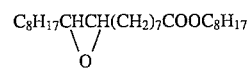  Solv-2
O=P(—O—C$_8$H$_{17}$(EH))$_3$   Solv-3
C$_8$H$_{17}$CHCH(CH$_2$)$_7$COOC$_8$H$_{17}$   Solv-4
\__O__/
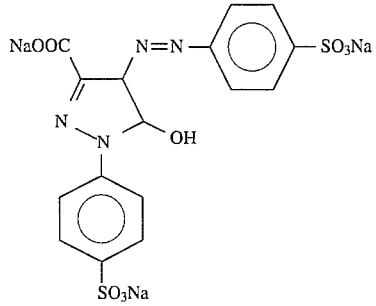  YF-1
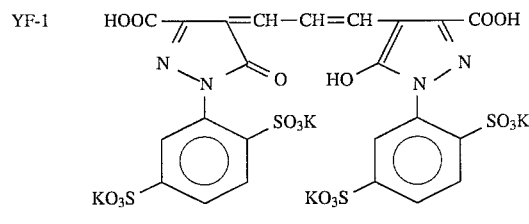  Dye-1
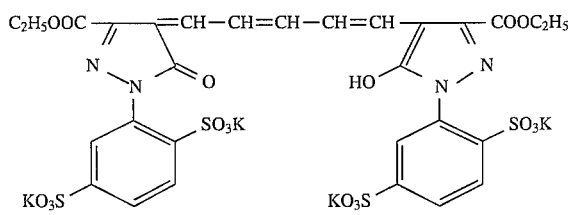  Dye-2
CH$_2$=CHSO$_2$CH$_2$SO$_2$CH=CH$_2$   H-1
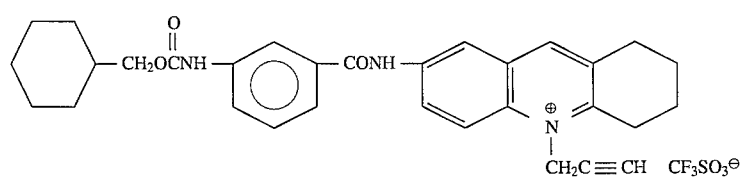  ExZK-1

-continued

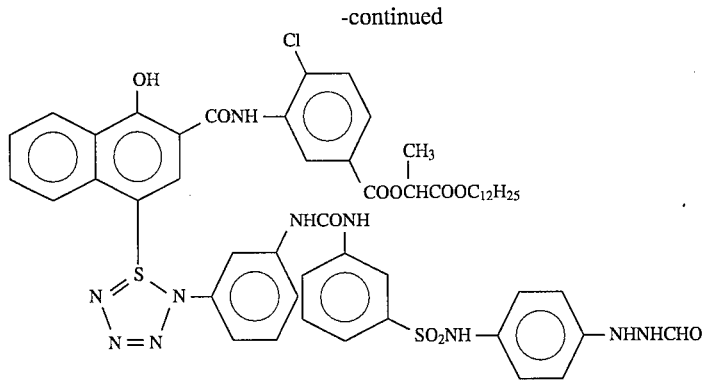

ExZK-2

Light-sensitive material samples 102 to 108 were each prepared in the same manner as light-sensitive material sample 101, except that cyan couples indicated in Table 1 was used in place of the cyan couplers therein (ExC-1 and ExC-2).

A 30 cm long, 30 cm wide and 1.1 mm thick transparent substrate made of borosilicate glass was coated with a 1:3 (by weight) mixture of gelatin and colloidal silica (average particle size: 7 to 9 mμ) to which saponin had been added as a surface active agent to a coating thickness of 0.2 μm.

Each of the protective layers of the above-described light-sensitive materials samples 101 to 108 was adhered to the coated surface of the transparent substrate, with slight moisture being supplied to the emulsion side of sample 101. The laminate was passed through a laminator set to provide a temperature of about 150° C. to the joint area at a linear speed of 0.45 m/minute. After allowing the laminate to cool to room temperature, the polyethylene terephthalate support of sample 101 was stripped off. The emulsion layers were found uniformly and intimately adhered to the glass substrate with no defect.

The emulsion layers thus transferred to the glass substrate were exposed to light of a tungsten lamp via a mask for a color filter composed of a blue portion, a green portion, a red portion, and a black portion and processed according to the following schedule to produce a color filter having three primaries (B, G and R) plus black.

| Processing Step | Temp. | Time |
|---|---|---|
| Hardening | 38° C. | 3 min |
| Washing-1 | 35° C. | 1 min |
| Color development | 38° C. | 5 min |
| Blix | 38° C. | 1 min |
| Washing-2 | 35° C. | 40 sec |
| Washing-3 | 35° C. | 40 sec |
| Drying | 60° C. | 2 min |

The processing solutions used each had the following composition.

Hardener:
  Anhydrous sodium sulfate 160.0 g
  Anhydrous sodium carbonate 4.6g
  Glutaraldehyde (25%) 20.0 ml
  Water to make 1 l
  pH (25° C. ) 10.0

Color Developer:
  D-Sorbitol 0.15 g
  Sodium naphthalenesulfonate-formalin 0.15 g condensate
  Pentasodium nitrilotris(methylenephosphonate) 1.80 g
  Diethylenetriaminepentaacetic acid 0.50 g
  1-Hydroxyethylidene-1,1-diphosphonic acid 0.15 g
  Diethylene glycol 12.0 ml
  Benzyl alcohol 13.5 ml
  Potassium bromide 0.70 g
  Benzotriazole 0.003 g
  Sodium sulfite 2.40 g
  Disodium-N,N-bis(sulfonatoethyl)hydroxylamine 8.0g
  Triethanolamine 6.00 g
  N-Ethyl-N-(β-methanesulfonamidoethyl)-3-methyl-4-aminoaniline sesquisulfate monohydrate 6.00 g
  Potassium carbonate 30.0 g
  Water to make 1 l
  pH (25° C.) 11.0

Bleaching-Fixing Solution:
  Ethylenediaminetetraacetic acid 5.0g
  Ammonium (ethylenediaminetetraacetato)iron (II) 55.0 g
  Ammonium thiosulfate (750 g/l) 160 ml
  Ammonium sulfite 40.0 g
  Ammonium nitrate 10.0 g
  Water to make 1 l
  pH (25° C.) 6.0

Washing Water:
  Deionized water having an electrical conductivity of 5 μS or less.

The cyan density in the black portion of the obtained color filter was measured, and the results are shown in Table 1 below.

Furthermore, the heat resistant property was examined by standing the color filter in an oven at 180° C. for one hour, and the light resistant property was examined by standing the color filter in a xenon tester at 85,000 lux for 10 days. The evaluations of the heat and light resistant properties are shown as a remaining rate of the cyan density (%) in Table 1.

TABLE 1

| Light-sensitive material | Cyan coupler | Added amount (g/m²) | Cyan density in black portion | Heat fastness (%) | Light fastness (%) | Remarks |
|---|---|---|---|---|---|---|
| 101 | ExC-1<br>ExC-2 | 0.28<br>0.32 | 2.42 | 52 | 84 | Comparison |
| 102 | Comparative coupler A | 0.70 | 2.30 | 65 | 87 | Comparison |
| 103 | Comparative Coupler B | 0.74 | 2.56 | 55 | 95 | Comparison |
| 104 | Coupler (4) | 0.71 | 2.50 | 95 | 94 | Invention |
| 105 | Coupler (10) | 0.59 | 2.41 | 93 | 90 | Invention |
| 106 | Coupler (12) | 0.70 | 2.55 | 90 | 90 | Invention |
| 107 | Coupler (16) | 0.76 | 2.52 | 94 | 91 | Invention |
| 108 | Coupler (21) | 0.79 | 2.48 | 92 | 93 | invention |

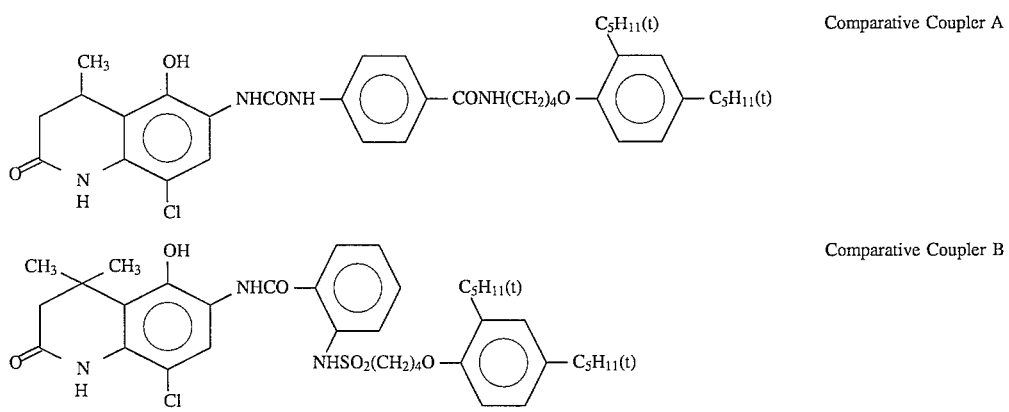

Comparative Coupler A

Comparative Coupler B

As is apparent from the results shown in Table 1, the color filters prepared by using the cyan coupler according to the present invention have an excellent coloring property and excellent heat resistant and light resistant properties.

EXAMPLE 2

A gelatin subbing layer was coated on PEN-1A support described in Example 1 of JIII Journal of Technical Disclosure No.94-6023. Layers from 1st to 9th shown below were applied simultaneously thereon to prepare color light-sensitive material sample 201. In the following layer structure, the numeral for each component is the spread in terms of gram per m². The spreads of silver halide emulsions and colloidal silver emulsions are expressed in terms of silver amount (g) per m². The compounds used were the same as used in Example 1. All the silver halide emulsions were negatively working silver chlorobromide emulsions.

1st Layer (Antihalation Layer):
  Gelatin 1.43
  Colloidal silver emulsion (0.02 μm) 0.20
  Surface active agent (Cpd-14) 0.06
2nd Layer (Irradiation-Preventive Dye Layer):
  Gelatin 0.70
  Irradiation preventive dyes (a mixture of Dye-1 and 2 at a molar ratio of 1:3) 0.02
3rd Layer (Blue-Sensitive Layer):
  Silver chlorobromide emulsion (Br content: 0.54 80 mol %; average grain size: 0.5 μm) spectrally sensitized with blue-sensitizing dye (ExS-14)
  Gelatin 1.60
  Cyan coupler (ExC-1) 0.15
  Cyan coupler (ExC-2) 0.17
  Magenta coupler (ExM-1) 0.21
  Dye image stabilizer (Cpd-1) 0.08
  Dye image stabilizer (Cpd-9) 0.05
  Dye image stabilizer (Cpd-10) 0.07
  Dye image stabilizer (Cpd-4) 0.12
  Dye image stabilizer (Cpd-18) 0.01
  Polymer (Cpd-13) 0.24
  High-boiling solvent (Solv-2) 0.35
  High-boiling solvent (Solv-3) 0.14
4th Layer (Intermediate Layer):
  Gelatin 1.20
  Color mixing inhibitor (Cpd-3) 0.04
  UV Absorbent (Cpd-1) 0.02
  UV Absorbent (Cpd-8) 0.04
  UV Absorbent (Cpd-9) 0.12
  UV Absorbent (Cpd-10) 0.06
  Polymer (Cpd-11) 0.10
5th Layer (Green-Sensitive Layer):
  Silver chlorobromide emulsion (Br content: 0.45 30 mol %; average grain size: 0.2 μm) spectrally sensitized with green-sensitizing dyes (ExS-12 and 13)
  Gelatin 1.55
  Cyan coupler (ExC-1) 0.15
  Cyan coupler (ExC-2) 0.17

Yellow coupler (ExY-1) 0.55
Dye image stabilizer (Cpd-1) 0.06
Dye image stabilizer (Cpd-9) 0.03
Dye image stabilizer (Cpd-10) 0.50
Dye image stabilizer (Cpd-21) 0.11
Polymer (Cpd-13) 0.17
High-boiling solvent (Solv-2) 0.11
High-boiling solvent (Solv-1) 0.25
6th Layer (Intermediate Layer):
  Gelatin 1.00
  Color mixing inhibitor (Cpd-3) 0.08
  UV Absorbent (Cpd-1) 0.01
  UV Absorbent (Cpd-8) 0.02
  UV Absorbent (Cpd-9) 0.06
  UV Absorbent (Cpd-10) 0.03
  Polymer (Cpd-11) 0.05
7th Layer (Red-Sensitive Layer):
  Silver chlorobromide emulsion (Br content: 0.60 25 mol %; average grain size: 0.2 μm) spectrally sensitized with red-sensitizing dye (ExS-11)
  Gelatin 1.80
  Yellow coupler (ExY-1) 0.48
  Magenta coupler (ExM-1) 0.20
  Dye image stabilizer (Cpd-21) 0.10
  Dye image stabilizer (Cpd-4) 0.12
  Dye image stabilizer (Cpd-18) 0.01
  High-boiling solvent (Solv-1) 0.24
  High-boiling solvent (Solv-2) 0.06
  High-boiling solvent (Solv-3) 0.12
  Compound (Cpd-22) 0.04
8th Layer (UV Absorbing Layer):
  Gelatin 0.50
  UV Absorber (Cpd-1) 0.01
  UV Absorber (Cpd-8) 0.02
  UV Absorber (Cpd-9) 0.06
  UV Absorber ( Cpd-10 ) 0.03
  Polymer ( Cpd- 11 ) 0.06
9th Layer ( Protective Layer):
  Gelatin 0.70
  Surface active agent (Cpd-14) 0.06
  Hardening agent ( H-1) 0.20

The blue-sensitive layer, green-sensitive layer, and red-sensitive layer further contained Cpd-23 in an amount of $4.0 \times 10^{-6}$ mol, $3.0 \times 10^{-5}$ mol, and $1.0 \times 10^{-5}$ mol, respectively, per mole of the corresponding silver halide.

The blue-sensitive layer and green-sensitive layer furthermore contained Cpd-16 in an amount of $1.2 \times 10^{-2}$ mol and $1.1 \times 10^{-2}$ mol, respectively, per mole of the corresponding silver halide.

In addition, each constituting layer contained sodium dodecylbenzenesulfonate as an emulsifying agent or a dispersant, ethyl acetate as an auxiliary solvent, Cpd-17 as a coating aid, and potassium polystyrenesulfonate as a thickener.

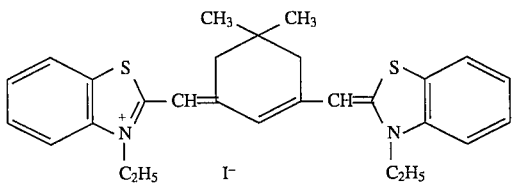

ExS-11

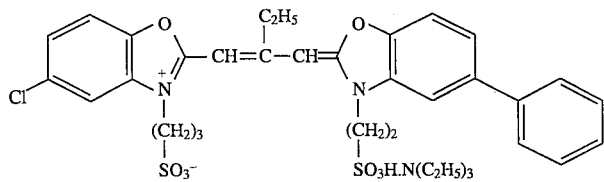

ExS-12

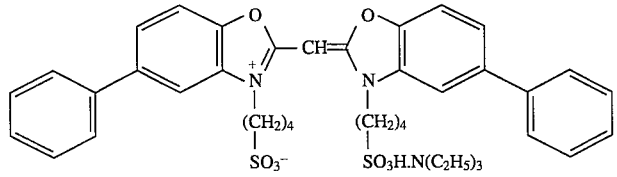

ExS-13

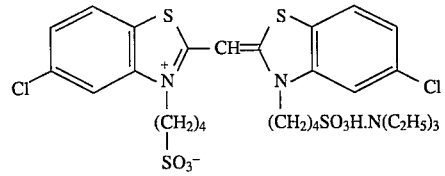

ExS-14

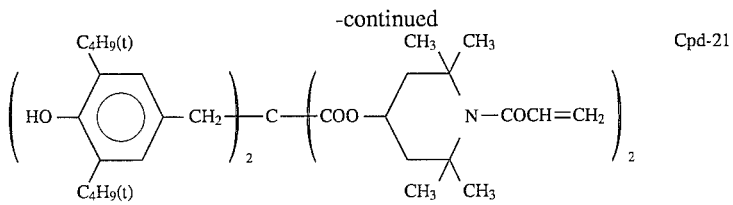

Cpd-21

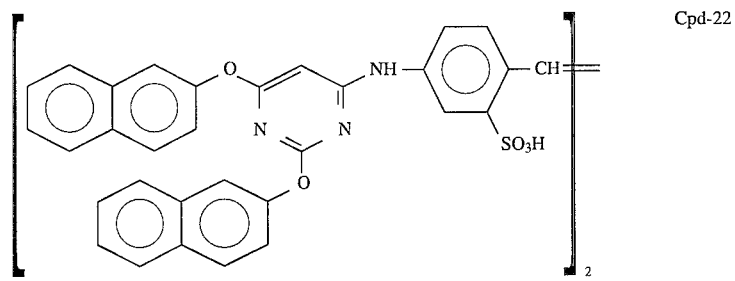

Cpd-22

Cpd-23

Light-sensitive material samples 202 to 206 were each prepared in the same manner as light-sensitive material 201, except that cyan couples indicated in Table 2 was used in place of the cyan couplers therein (ExC-1 and ExC-2).

The color developer used had the following composition. Other processing solutions each had the same composition as used in Example 1.

Color Developer:

TABLE 2

| Light-sensitive material | Cyan coupler | Added amount in blue-sensitive layer (g/m$^2$) | Added amount in green-sensitive layer (g/m$^2$) | Remarks |
|---|---|---|---|---|
| 201 | ExC-1 | 0.15 | 0.15 | Comparison |
|  | ExC-2 | 0.17 | 0.17 |  |
| 202 | Comparative Coupler B | 0.40 | 0.38 | Comparison |
| 203 | Coupler (1) | 0.39 | 0.37 | Invention |
| 204 | Coupler (6) | 0.32 | 0.32 | Invention |
| 205 | Coupler (9) | 0.27 | 0.27 | Invention |
| 206 | Coupler (27) | 0.30 | 0.29 | Invention |

The emulsion layers on the transparent support were exposed to light of a tungsten lamp via a mask for a color filter composed of a blue portion, a green portion, and a red portion from the emulsion layer side, and processed according to the following steps to produce a color filter having three primaries (B, G and R) plus black.

| Processing Step | Temp. | Time |
|---|---|---|
| Color development | 38° C. | 1.5 min |
| Blix | 38° C. | 1 min |
| Washing-2 | 35° C. | 1 min |
| Washing-3 | 35° C. | 1 min |
| Washing-4 | 35° C. | 30 sec |
| Drying | 80° C. | 1 min |

(Washing-2, 3 and 4 were carried out in a counter-flow system from tank 4 toward tank 2)

Water 800 ml
Ethylenediaminetetraacetic acid 3.0 g
Disodium 4,5-dihydroxybenzene-1,3-disulfonate 0.5 g
Triethanolamine 12.0 g
Potassium chloride 6.5 g
Potassium bromide 0.03 g
Potassium carbonate 27.0 g
Disodium-N,N-bis(sulfonatoethyl)-hydroxylamine 5.0 g
Sodium triisopropylnaphthalene-β-sulfonate 0.1 g
N-Ethyl-N-(β-methanesulfonamidoethyl)-3-methyl-4-aminoaniline sesquisulfate monohydrate 5.0 g
Water to make 1000 ml
pH (25° C.) 10.00

The heat resistance and light resistance of the obtained color filter were evaluated in the same manner as in Example 1.

The color filters prepared by using the cyan dye according to the present invention have more excellent heat resistance and light resistance than the comparative color filters.

As described and demonstrated above, the present invention makes it possible to produce a color filter having excellent heat resistance and light resistance with extreme ease. The color filter obtained comprises a blue portion, a green portion and a red portion each having excellent spectral transmission characteristics and a black portion of high density with good precision suffering from neither loss of color definition nor white spot.

While the invention has been described in detail and with reference to specific examples thereof, it will be apparent to one skilled in the art that various changes and modifications can be made therein without departing from the spirit and scope thereof.

What is claimed is:

1. A process for producing a color filter, which comprises the steps of (a) pattern-exposing a light-sensitive material comprising a light-transmitting substrate having thereon at least three silver halide emulsion layers, and (b) subjecting the exposed light-sensitive material to color development processing, bleaching and fixing processing, and washing processing, wherein the at least three silver halide emulsion layers (i) comprise a layer containing at least a cyan coupler, a layer containing at least a magenta coupler and a layer containing at least a yellow coupler and (ii) have different color sensitivity;

and the cyan coupler is a compound represented by the following formula (I):

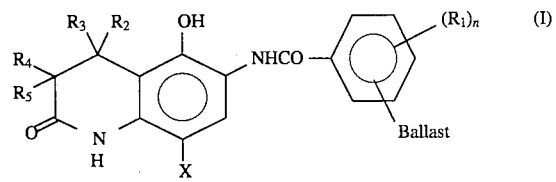

wherein $R_1$ represents a halogen atom, an alkyl group, an alkoxy group, an acylamino group or a carbamoyl group, and any two of plural $R_1$ groups may be combined with each other to form a 5- or 6-membered ring;

n represents an integer of from 0 to 4;

$R_2$ and $R_3$ are the same or different and each represents an alkyl group or an aryl group, and $R_2$ and $R_3$ may be combined with each other to form a 5- or 6-membered ring;

$R_4$ and $R_5$ are the same or different and each represents a hydrogen atom or an alkyl group;

X represents a hydrogen atom or a group which is eliminatable by an oxidation-coupling reaction with a developing agent; and Ballast represents a nondiffusive dye having 12 or more total carbon atoms, with the proviso that, when n is 2 or more, the plurality of $R_1$ groups are be the same or different.

2. The process as claimed in claim 1, wherein X is selected from the group consisting of a hydrogen atom, a halogen atom, an alkoxy group, an aryloxy group, an acyloxy group, a sulfonyloxy group, a carbonamido group, a sulfonamido group, an alkoxycarbonyloxy group, an arylcarbonyloxy group, an imido group and a pyrazol group.

3. The process as claimed in claim 1, wherein Ballast is selected from the group consisting of a straight chain or branched alkyl group, an alkoxy group, an acylamino group and a carbamoyl group.

4. A color filter produced by a process, which comprises the steps of (a) pattern-exposing a light-sensitive material comprising a light-transmitting substrate having thereon at least three silver halide emulsion layers, and (b) subjecting the exposed light-sensitive material to color development processing, bleaching and fixing processing, and washing processing, wherein the at least three silver halide emulsion layers (i) comprise a layer containing at least a cyan coupler, a layer containing at least a magenta coupler and a layer containing at least a yellow coupler and (ii) have different color sensitivity;

and the cyan coupler is a compound represented by the following formula (I):

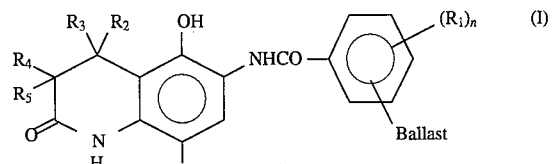

wherein $R_1$ represents a halogen atom, an alkyl group, an alkoxy group, an acylamino group or a carbamoyl group, and any two of plural $R_1$ groups are combined with each other to form a 5- or 6-membered ring;

n represents an integer of from 0 to 4;

$R_2$ and $R_3$ are the same or different and each represents an alkyl group or an aryl group, and $R_2$ and $R_3$ may be combined with each other to form a 5- or 6-membered ring;

$R_4$ and $R_5$ are the same or different and each represents a hydrogen atom or an alkyl group;

X represents a hydrogen atom or a group which is eliminatable by an oxidation-coupling reaction with a developing agent; and Ballast represents a nondiffusive dye having 12 or more total carbon atoms, with the proviso that, when n is 2 or more, the plurality of $R_1$ groups may be the same or different.

5. The color filter as claimed in claim 4, wherein X is selected from the group consisting of a hydrogen atom, a halogen atom, an alkoxy group, an aryloxy group, an acyloxy group, a sulfonyloxy group, a carbonamido group, a sulfonamido group, an alkoxycarbonyloxy group, an arylcarbonyloxy group, an imido group and a pyrazol group.

6. The color filter as claimed in claim 4, wherein Ballast is selected from the group consisting of a straight chain or branched alkyl group, an alkoxy group, an acylamino group and a carbamoyl group.

* * * * *